United States Patent [19]
Santin et al.

[11] Patent Number: 5,056,063
[45] Date of Patent: Oct. 8, 1991

[54] ACTIVE SENSE AMPLIFIER WITH DYNAMIC PRE-CHARGE TRANSISTOR

[75] Inventors: Giovanni Santin; Giovanni Naso, both of Houston, Tex.

[73] Assignee: Texas Instruments Incorporated, Dallas, Tex.

[21] Appl. No.: 529,292

[22] Filed: May 29, 1990

[51] Int. Cl.$^5$ .......................................... G11C 11/409
[52] U.S. Cl. .................... 365/208; 365/203; 307/530
[58] Field of Search ................ 307/530; 365/203, 208

[56] References Cited
U.S. PATENT DOCUMENTS

| | | | |
|---|---|---|---|
| 4,567,387 | 1/1986 | Wacyk | 365/208 |
| 4,742,253 | 5/1988 | Giebel | 307/530 |
| 4,788,460 | 11/1988 | Kobatake | 307/530 |
| 4,800,297 | 1/1989 | Novosel et al. | 307/530 |
| 4,962,482 | 10/1990 | Jinbo | 365/208 |

Primary Examiner—Joseph E. Clawson, Jr.
Attorney, Agent, or Firm—Theodore D. Lindgren; Lawrence J. Bassuk; Melvin Sharp

[57] ABSTRACT

A sense amplifier including a pair of P-conductivity-type current-mirror transistors, a N-conductivity-type reference transistor and a cascode-connected N-conductivity-type transistor and inverter connected according to prior-art. The amplifier also includes a N-conductivity-type pre-charge transistor with source-drain path connected in parallel with the source-drain path of P-conductivity-type mirror load transistor. The gate of the pre-charge transistor is connected to the gate of the N-conductivity-type cascode transistor, which is also connected to the output of cascode inverter.

The pre-charge transistor functions to bypass the mirror load transistor when a discharged bitline is selected. As a result, the current charging the bitline capacitance is increased and the time needed for charging is decreased. As an additional benefit, the bitline-charging current through the pre-charge transistor bypasses the current mirror load transistor, greatly diminishing the probability of a read error being mirrored to the output of sense amplifier.

20 Claims, 1 Drawing Sheet

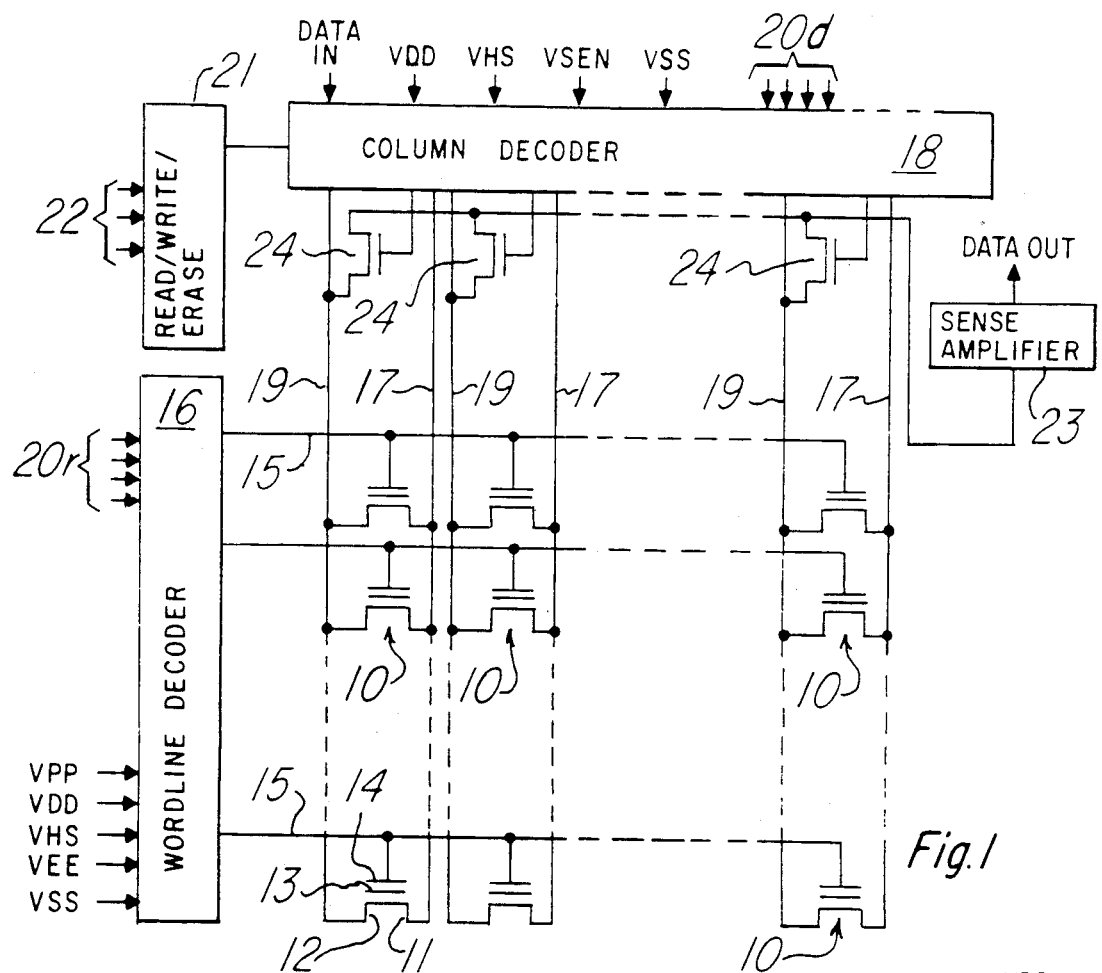
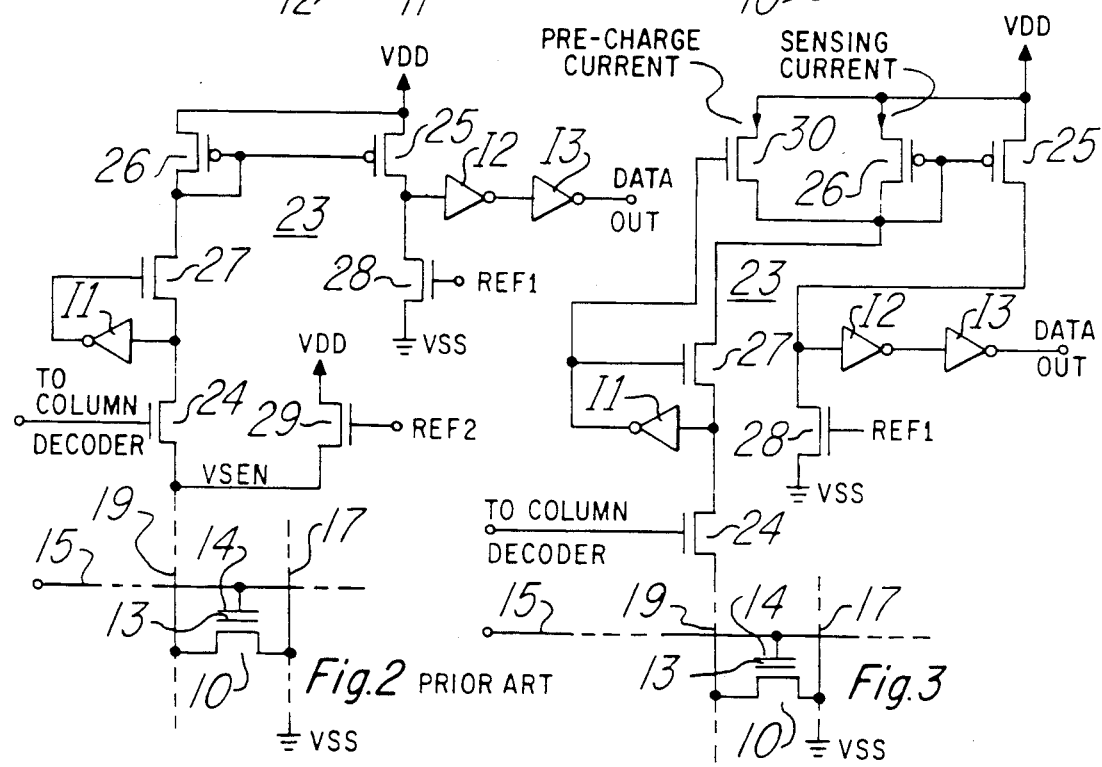
Fig.1
Fig.2 PRIOR ART
Fig.3

ACTIVE SENSE AMPLIFIER WITH DYNAMIC PRE-CHARGE TRANSISTOR

BACKGROUND OF THE INVENTION

This invention relates to a semiconductor memory devices and more particularly to an improved sense amplifier for an electrically-erasable, electrically-programmable, read-only-memory (EEPROM) memory.

An EEPROM memory cell typically comprises a floating-gate field-effect transistor. The floating-gate conductor of a programmed memory cell is charged with electrons, and the electrons in turn render the source-drain path under the charged floating gate nonconductive when a predetermined voltage is applied to the control gate. The nonconductive state is read by a sense amplifier as a "zero" bit. The floating-gate conductor of a non-programmed cell is neutrally charged (or slightly positively or negatively charged) such that the source-drain path under the non-programmed floating gate is conductive when the predetermined voltage is applied to the control gate. The conductive state is read by a sense amplifier as a "one" bit.

Each column and row of an EEPROM array may contain thousands of floating-gate memory cells. The sources of each cell in a column are connected to a source-column line and the source-column line for a selected cell may be connected to reference potential or ground during reading of the selected cell by a sense amplifier. The drains of each cell in a column are connected to a separate bitline (drain-column line) and the drain-column line for a selected cell is connected to the input of the sense amplifier during reading of the selected cell. The control gates of each cell in a row are connected to a wordline, and the wordline for a selected cell is connected to the predetermined select voltage during reading of the selected cell.

One of the problems encountered during use of sense amplifiers has been the capacitance of the drain-column line. If the drain-column-line capacitance is allowed to discharge during the time between readings, and a selected memory cell 10 has a charged (programmed "0") floating gate, then the initial surge of current through prior-art sense amplifier as the drain-column-line capacitance is charged. The initial surge of current either (a) causes a read error at the output of prior-art sense amplifier or (b) makes it necessary increase the access time to allow the drain-column line to be charged before reading selected cell. A prior-art method of preventing the drain-column line from discharging has been to charge the drain-column line through use of pre-charge circuitry. While use of pre-charge circuitry improves access time, the disadvantage of that use is that such circuitry draws a large direct current from supply-voltage source.

SUMMARY OF THE INVENTION

The sense amplifier, or current-mirror circuit, of this invention includes a pair of P-conductivity-type current-mirror-connected transistors, a N-conductivity-type reference transistor and a N-conductivity-type cascode-connected transistor with an inverter. The amplifier also includes a N-conductivity-type precharge transistor with source-drain path connected in parallel with the source-drain path of P-conductivity-type mirror load transistor. The gate of the pre-charge transistor is connected to the gate of the N-conductivity-type cascode transistor, which is also connected to the output of cascode inverter.

The pre-charge transistor functions to bypass the mirror load transistor when a discharged drain-column line is selected. As a result, the current that charges the drain-column-line capacitance is increased and the charging time is decreased. The decrease in charging time has been demonstrated to be in the range of 15 to 20 percent. As an additional benefit, the drain-column-line charging current through the pre-charge transistor bypasses the current-mirror load transistor, greatly diminishing the probability that a read error will be mirrored to the output of sense amplifier.

The sense amplifier, or compensated current-mirror circuit, of this invention eliminates the need for pre-charge circuitry to maintain the voltage on drain-column lines and, therefore, eliminates the excessive current demands on the supply-voltage source related to such circuitry.

BRIEF DESCRIPTION OF THE DRAWINGS

The novel features of this invention are set forth in the appended claims. The invention, its features, and its advantages are described below in conjunction with the following drawings:

FIG. 1 is a representation of an array of nonvolatile memory cells showing connection to a sense amplifier.

FIG. 2 is a schematic representation of a prior-art sense amplifier.

FIG. 3 is a schematic representation of the sense amplifier of this invention.

DETAILED DESCRIPTION OF A SPECIFIC EMBODIMENT

Referring to FIG. 1, an example array of EEPROM memory cells, which is an integral part of a memory chip, is shown for the purpose of illustrating this invention. Each EEPROM cell is a floating-gate transistor 10 having a source electrode 11, a drain electrode 12, a floating gate 13 and a control gate 14. Each of the control gates 14 in a row of cells 10 is connected to a wordline 15, and each of the wordlines 15 is connected to a wordline decoder 16. Each of the source electrodes 11 in a column of cells 10 is connected to a source-column line 17, and each of the source-column lines 17 is connected to a column decoder 18. Each of the drain electrodes 12 in a column of cells 10 is connected to a drain-column line (bitline) 19, and each of the bitlines 19 is connected to the column decoder 18.

In a write or program mode, the wordline decoder 16 may function, in response to wordline address signals on lines 20r and to a signal from read/write/erase control circuit 21, to place a preselected first programming voltage Vpp (approx. +16 to +18 volts) on a selected wordline 15, including a selected control-gate conductor 14. Read/write/erase control circuit 21 acts in response to microprocessor signal inputs on lines 22. Column decoder 18, in response to signals on lines 20d and to a signal from read/write/erase control circuit 21, may function to place a preselected second programming voltage (reference potential Vss or ground, or a non-positive voltage) on selected source-column line 17, which includes a selected source region 11. The preselected second programming voltage Vss must differ sufficiently from the first preselected programming voltage Vpp that excess electrons will migrate, perhaps by Fowler-Nordheim tunnelling, to the selected floating-gate conductor 13 and, as a result, program that selected floating-gate conductor 13. Column decoder 18 may optionally, in response to signals on lines 20d and to a signal from read/write/erase control 21, place a third preselected voltage Vhs (approx. +7 volts above Vss) on deselected source-column lines 17, including deselected source regions 11 within the array, to prevent a disturb of programmed floating-gate conductors associated with the deselected source regions 11. The wordline decoder 16 may optionally, in response to wordline address signals on lines 20r and to a signal from read/write/erase control 21, place a fourth preselected voltage, which may also be Vhs (approx. +7 volts), on deselected wordlines 15, including deselected control-gate conductors 14. The fourth preselected voltage should be sufficiently close to the second programming voltage that the floating-gate conductors 13 associated with the deselected wordlines 15 will not be programmed as a result, but should be sufficiently high that stress will be reduced across any tunnelling windows of cells 10 in deselected wordlines 15, thereby avoiding de-programming of pre-programmed cells 10. The third and fourth preselected voltages should be placed on the respective electrodes before both first and second preselected programming voltages Vpp and Vss are both placed on their respective electrodes. The first programming voltage Vpp may be placed on the control-gate conductors 14 in a gradual manner so as to reduce voltage-induced stress on the selected cell 10. The drain-column lines 19 may be left floating. The floating gate 13 of the selected cell 10 is charged With electrons during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

During erase mode of operation, the column decoder 18 may, for example, function to apply a positive voltage Vdd (approx. +5 volts) to the selected source-column line 17. The column decoder 18 may also, for example, function to leave at least the selected drain-column line 19 floating. The wordline decoder 16 may, for example, function to apply a high negative voltage Vee (approx. −11 volts) to the selected wordline 15. The applied voltages function to remove excess electrons from the floating gate 13 of the a selected programmed cell 10.

In the read mode, the wordline decoder 16 functions, in response to wordline address signals on lines 20r and to a signal from read/write/erase control circuit 21, to apply a preselected positive voltage Vdd (approx. +3 to +5 volts) to the selected wordline 15 (and the selected control gate 14), and to apply a low voltage (ground or Vss) to deselected wordlines 15. The column decoder 18 functions, in response to column address signals on lines 20d, to apply a preselected positive voltage Vsen (approx. +1 to +1.5 volts) to the selected drain-column line 19. The column decoder 18 also functions to connect all source-column lines 17 to ground (or Vss). The conductive or nonconductive state of the cell 10 connected to the selected drain-column line 19 and the selected wordline 15 is detected by sense amplifier 23, which supplies data to the DATA OUT terminal. The sense amplifier 23 is connected to the selected bitline 19 by the source-drain path of select field-effect transistor 24. The gate of select transistor 24 is connected to column decoder 18.

As is well-known, the source 11 regions and the drain 12 regions of the memory cells 10 may be interchanged for the various modes of operation. For example, Fowler-Nordheim tunnelling for programming and/or erasing may take place between a drain 12 region and a floating-gate conductor 13, or between a source 11 region and a floating-gate conductor 13. Voltages applied to the source 11 and drain 12 regions in the read example above are interchangeable. Therefore, the terms "source" and "drain" as used herein are considered interchangeable for each mode of operation. The term "source-drain electrode" is used herein to imply a connection to either source 11 or drain 12.

For convenience, a table of read, write and erase voltages is given in the TABLE I below:

TABLE I

|  | Read | Write | Erase |
|---|---|---|---|
| Selected Wordline | 3–5 V | 16–18 V | −11 V |
| Deselected Wordlines | 0 V | 7 V |  |
| Selected Source Line | 0 V | 0 V | 5 V |
| Deselected Source Lines | Float | 7 V |  |
| Drain Lines | 1–1.5 V | Float | Float |

FIG. 2 is a illustrates schematically a prior-art sense amplifier, or current-mirror circuit, 23. As in FIG. 1, bitline 19 is connected to a representative floating-gate memory cell 10. The control gate 14 of memory cell 10 is connected to a wordline 15, which is connected to wordline decoder 16 of FIG. 1. Source-column line 17 is connected by column decoder 18 of FIG. 1 to a reference potential Vss, which may be ground. The source-drain path of N-conductivity-type select transistor 24 connects the input of sense amplifier 23 to bitline 19 of the selected cell 10. The gate of select transistor 24 is connected to column decoder 18 of FIG. 1. The prior-art sense amplifier includes a pair of P-conductivity-type current-mirror transistors 25 and 26 in which field-effect transistor 25 mirrors the current through load mirror transistor 26. Current-mirror transistors 25 and 26 each have a commonly-connected source-drain electrodes and have gates connected to each other. The commonly-connected source-drain electrodes of transistor 25 and 26 are connected to supply-voltage source Vdd. Transistors 25 and 26 may ratio current such that the current through transistor 25 is, for example, equal to twice the current through transistor 26. A predetermined ratio may be realized by the well-known practice of forming the respective source-drain paths of transistors 25 and 26 with proper relative dimensions. The gate of current-mirror transistor 26 is connected to its second source-drain electrode, which is also connected to a source-drain electrode of the source-drain path of optional N-conductivity-type cascode transistor 27. The second source-drain electrode of transistor 27, or the input "IN" of sense amplifier 23, is connected to the input of optional inverter I1. The output of inverter I1 is connected to the gate of cascode transistor 27. The cascode connection of inverter I1 and transistor 27 serves to improve the access time for the memory array. If the impedance at the input terminal IN is low, the inverter I1 will cause transistor 27 to conduct and if the impedance input terminal IN is high, the inverter I1 will cause transistor 27 to be nonconductive. A impedance corresponding to, but increased over, the bitline impedance at terminal IN is measured at the common terminal of transistors 26 and 27.

The second source-drain electrode of P-conductivity-type field-effect transistor 25 is connected to a source-drain electrode of N-conductivity-type reference transistor 28. The second source-drain electrode of reference transistor 28 is connected to a source Vss of reference potential and the gate of reference transistor 28 is connected to a derived-voltage source REF1. The derived-voltage source REF1 may be derived from a dummy cell to provide compensation for process variations during manufacture. The output of the prior-art sense amplifier 23 is taken from the commonly connected source-drain electrodes of transistors 25 and 28 and is transmitted through two optional series-connected inverters I2 and I3 in the customary manner to cause the output signal to driven to high and low logic levels.

If a selected memory cell 10 has an uncharged (programmed "1") floating gate, then current will flow through the source-drain path of selected select transistor 24 when the selected wordline 15 is energized at read voltage Vdd. The current will be mirrored through transistors 26 and 25, amplified by inverters I2 and I3, causing a "1" to appear at the output DATA OUT of the sense amplifier 23. However, is a selected memory cell 10 has a charged (programmed "0") floating gate, then there will, if bitline 19 has been allowed to discharge, be an initial surge of current through load transistor 26 followed by no current flow. The initial surge of current is caused by charging of the bitline 19 capacitance and either (a) causes a read error at the output of sense amplifier 23 or (b) makes it necessary increase the access time to allow bitline 19 to be charged before reading selected cell 10. A prior method of preventing bitline 19 from discharging, as illustrated in FIG. 2, has been to charge bitline 19 through use of a N-conductivity-type pre-charge transistor 29 with source-drain path connected between supply-voltage source Vdd and bitline 19 and with gate connected to a second derived-reference-voltage source REF2. The second derived-reference-voltage source REF 2 may be, for example, approximately 2.5 volts to cause a voltage Vsen of approximately 1.5 volts on bitlines 19. While use of pre-charge transistor 29 improves access time, the disadvantage of that use is that transistor 29 draws a large direct current from source Vdd.

Referring now to FIG. 3, the sense amplifier, or current-mirror circuit, of this invention is illustrated using the same P-conductivity-type current-mirror transistors 25 and 26, the same N-conductivity-type reference transistor 28 and the same cascode-connected transistor 27 and inverter I1 as illustrated in the prior-art circuit of FIG. 2. However, rather than the N-conductivity-type pre-charge transistor 29 of FIG. 2, the circuit of FIG. 3 uses N-conductivity-type pre-charge transistor 30 with source-drain path connected in parallel with the source-drain path of P-conductivity-type mirror transistor 26. The gate of pre-charge transistor 30 is connected to the gate of N-conductivity-type transistor 27, which is also connected to the output of inverter I1. Pre-charge transistor 30 functions to bypass load transistor 26 when a discharged bitline 19 is selected. If the bitline 19 voltage is at reference potential Vss, then inverter I1 will place a high voltage signal on the gate of transistor 30, causing the source-drain path of transistor 30 to become highly conductive. As a result, the current charging the bitline 19 capacitance is increased and the time needed for charging is decreased. As an additional benefit, the bitline-charging current through transistor 30 bypasses current mirror transistor 26, greatly diminishing the probability of a read error being mirrored to the output of sense amplifier 23.

It should also be noted that the circuit of this invention eliminates the need for deriving a second reference-voltage source REF2 of FIG. 2 and the voltage Vsen of FIG. 1.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A sense amplifier, comprising:
an input and an output;
a supply-voltage source, a derived-voltage source and a reference potential;
first and second current-mirror transistors of a first conductivity-type, each said current-mirror transistor having a first and a second source-drain electrode and a gate, each said first source-drain electrode of said each said current-mirror transistor connected to said supply-voltage source, said second source-drain electrode of said first current-mirror transistor connected to furnish a signal to said output of said sense amplifier, said second source-drain electrode of said second current-mirror transistor connected to sense an impedance corresponding to an impedance at said input of said sense amplifier, each said gate of said first and second current-mirror transistors connected to the other said gate, said gate of said second current-mirror transistor connected to said second source-drain electrode of said second current-mirror transistor;
a reference transistor of a second conductivity-type having a first and a second source-drain electrode and a gate, said first source-drain electrode of said reference transistor connected to said second source-drain electrode of said first current-mirror transistor, said second source-drain electrode of said reference transistor connected to said reference potential, said gate of said reference transistor connected to said derived-voltage source; and
a first inverter having an input and an output, said input of said first inverter connected to said input of said sense amplifier,
a pre-charge transistor of said second conductivity-type having a first and a second source-drain electrode and a gate, said first source-drain electrode of said pre-charge transistor connected to said supply-voltage source, said second source-drain electrode of said pre-charge transistor connected to said second source-drain electrode of said second current-mirror transistor, said gate of said pre-charge transistor connected to said output of said first inverter.

2. The sense amplifier of claim 1, including:
a cascode transistor of said second conductivity-type having a source-drain path and a gate, said source-drain path of said cascode transistor connected between said second source-drain electrode of said second current-mirror transistor and said input of said sense amplifier, said gate of said cascode transistor connected to said output of said first inverter.

3. The sense amplifier of claim 1, including:

second and third inverters, each having an input and an output, said output of said second inverter connected to said input of said third inverter, said input of said second converter and said output of said third inverter connected such that said second and third inverters are between said second source-drain electrode of said first current-mirror transistor and said output of said sense amplifier.

4. The sense amplifier of claim 1, including
at least one bitline input;
at least one column-decoder input; and
at least one select transistor of said second conductivity-type having a source-drain path and a gate, said source-drain path of said select transistor connected between said input of said sense amplifier and said bitline input, said gate of said select transistor connected to a said column-decoder input.

5. The sense amplifier of claim 1, wherein said first conductivity-type is P-type and said second conductivity-type is N-type.

6. The sense amplifier of claim 1, wherein said first and second current-mirror transistors are formed with relative dimensions such that the current through said second current-mirror transistor has a predetermined ratio to the current through said first current-mirror transistor.

7. A memory array, comprising:
a supply-voltage source, a derived-voltage source, and a reference potential;
rows and columns of memory cells, each said memory cell connected to a bitline;
a sense amplifier having an input and an output, said sense amplifier including:
  first and second current-mirror transistors of a first conductivity-type, each of said current-mirror transistors having a first and a second source-drain electrode and a gate, each said first source-drain electrode of said first and second current-mirror transistors connected to said supply-voltage source, said second source-drain electrode of said first current-mirror transistor connected to furnish a signal to said output of said sense amplifier, said second source-drain electrode of said second current-mirror transistor connected to receive a signal from said input of said sense amplifier, said gates of said first and second current-mirror transistors connected to each other, said gate of said second current-mirror transistor connected to said second source-drain electrode of said second current-mirror transistor;
  a reference transistor of a second conductivity-type having a first and a second source-drain electrode and a gate, said first source-drain electrode of said reference transistor connected to said second source-drain electrode of said first current-mirror transistor, said second source-drain electrode of said reference transistor connected to said reference potential, said gate of said reference transistor connected to said derived-voltage source; and
  a first inverter having an input and an output, said input of said first inverter connected to said input of said sense amplifier,
  a pre-charge transistor of said second conductivity-type having a first and a second source-drain electrode and a gate, said first source-drain electrode of said pre-charge transistor connected to said supply-voltage source, said second source-drain electrode of said pre-charge transistor connected to said second source-drain electrode of said second current-mirror transistor, said gate of said pre-charge transistor connected to said output of said first inverter.

8. The memory array of claim 7, wherein said memory cells are of the floating-gate type.

9. The memory array of claim 7, wherein said sense amplifier includes:
a cascode transistor of said second conductivity-type having a source-drain path and a gate, said source-drain path of said cascode transistor connected between said second source-drain electrode of said second current-mirror transistor and said input of said sense amplifier, said gate of said cascode transistor connected to said output of said first inverter.

10. The memory array of claim 7, wherein said sense amplifier includes:
second and third inverters, each having an input and an output, said input of said second inverter connected to said second source-drain electrode of said first current-mirror transistor, said output of said second inverter connected to said input of said third inverter, said output of said third inverter connected to said output of said sense amplifier.

11. The memory array of claim 7, wherein each said cell in a column is connected to a column decoder and wherein said sense amplifier includes at least one select transistor of said second conductivity-type for connecting said input of said amplifier to a said bitline in response to a signal from said column decoder.

12. The memory array of claim 7, wherein said first conductivity-type is P-type and said second conductivity-type is N-type.

13. The memory array of claim 7, wherein said first and second current-mirror transistors are formed with relative dimensions such that the current through said second current-mirror transistor has a predetermined ratio to the current through said first current-mirror transistor.

14. A current-mirror circuit, comprising:
a first terminal for sensing impedance;
a second terminal for providing an output corresponding to said impedance;
a supply-voltage source;
first and second current-mirror transistors of a first conductivity-type, each said current-mirror transistor having a first and a second source-drain electrode and a gate, each said first source-drain electrode of said each said current-mirror transistor connected to said supply-voltage source, said second source-drain electrode of said first current-mirror transistor connected to furnish a signal to said second terminal, said second source-drain electrode of said second current-mirror transistor connected to said first terminal, each said gate of said first and second current-mirror transistors connected to the other said gate, said gate of said second current-mirror transistor connected to said second source-drain electrode of said second current-mirror transistor; and
a first inverter having an input and an output, said input of said first inverter connected to said first terminal,
a pre-charge transistor of said second conductivity-type having a first and a second source-drain electrode and a gate, said first source-drain electrode of said pre-charge transistor connected to said supply-voltage source, said second source-drain electrode of said pre-charge transistor connected to said second source-drain electrode of said second current-mirror transistor, said gate of said pre-charge transistor connected to said output of said first inverter.

15. The current-mirror circuit of claim 14, including:
a reference potential and a derived-voltage source; and
a reference transistor of a second conductivity-type having a first and a second source-drain electrode and a gate, said first source-drain electrode of said reference transistor connected to said second source-drain electrode of said first current-mirror transistor, said second source-drain electrode of said reference transistor connected to said reference potential, said gate of said reference transistor connected to said derived-voltage source.

16. The current-mirror circuit of claim 14, including:
a cascode transistor of said second conductivity-type having a source-drain path and a gate, said source-drain path of said cascode transistor connected between said second source-drain electrode of said second current-mirror transistor and said first terminal, said gate of said cascode transistor connected to said output of said first inverter.

17. The current-mirror circuit of claim 14, including:
second and third inverters, each having an input and an output, said input of said second inverter connected to said second terminal, said output of said second inverter connected to said input of said third inverter.

18. The current-mirror circuit of claim 14, including:
at least one bitline input;
at least one column-decoder input; and
at least one select transistor of said second conductivity-type having a source-drain path and a gate, said source-drain path said select transistor connected between said first terminal and a said bitline input, said gate of said select transistor connected to a said column-decoder input.

19. The current-mirror circuit of claim 14, wherein said first conductivity-type is P-type and said second conductivity-type is N-type.

20. The current-mirror circuit of claim 1, wherein said first and second current-mirror transistors are formed with relative dimensions such that the current through said second current-mirror transistor has a predetermined ratio to the current through said first current-mirror transistor.

* * * * *